(12) United States Patent
Lin et al.

(10) Patent No.: US 6,376,366 B1
(45) Date of Patent: Apr. 23, 2002

(54) PARTIAL HARD MASK OPEN PROCESS FOR HARD MASK DUAL DAMASCENE ETCH

(75) Inventors: Li-Te S. Lin, Hsin-chu; Li-Chih Chao, Yang-mei, both of (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/860,371

(22) Filed: May 21, 2001

(51) Int. Cl.[7] .......................................... H01L 21/4763
(52) U.S. Cl. ...................... 438/637; 438/634; 438/717; 438/942
(58) Field of Search ................................. 438/618–629, 438/634, 637–639, 717, 942

(56) References Cited

U.S. PATENT DOCUMENTS

| | | | |
|---|---|---|---|
| 5,468,342 A | * 11/1995 | Nulty et al. | |
| 6,077,769 A | 6/2000 | Huang et al. | 438/622 |
| 6,127,089 A | 10/2000 | Subramanian et al. | 430/270 |
| 6,140,220 A | 10/2000 | Lin | 438/618 |
| 6,140,226 A | 10/2000 | Grill et al. | 438/637 |

* cited by examiner

Primary Examiner—Jey Tsai
(74) Attorney, Agent, or Firm—George O. Saile; Stephen B. Ackerman; Sevgin Oktay

(57) ABSTRACT

A method is provided for forming dual damascene structures with a partial hard mask through a judicious use of partial opening or etching of the mask which simplifies the dual damascene process, and makes it especially suitable for low-k dielectric materials in advanced sub-micron technologies capable of forming features approaching less than 0.10 micrometers ($\mu m$). This is accomplished by forming a hard mask over a low-k dielectric layer. The hard mask is first opened partially to form a trench, and later again to form a via opening. The via opening is next extended into the low-k dielectric layer, followed by etching further the partial trench into the hard mask, and then transferring the trench pattern into the dielectric layer while at the same time extending the via opening to the underlying metal layer.

31 Claims, 7 Drawing Sheets

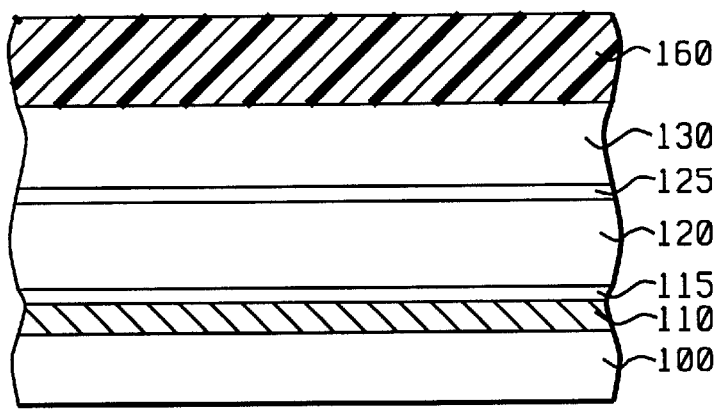
FIG. 1a – Prior Art
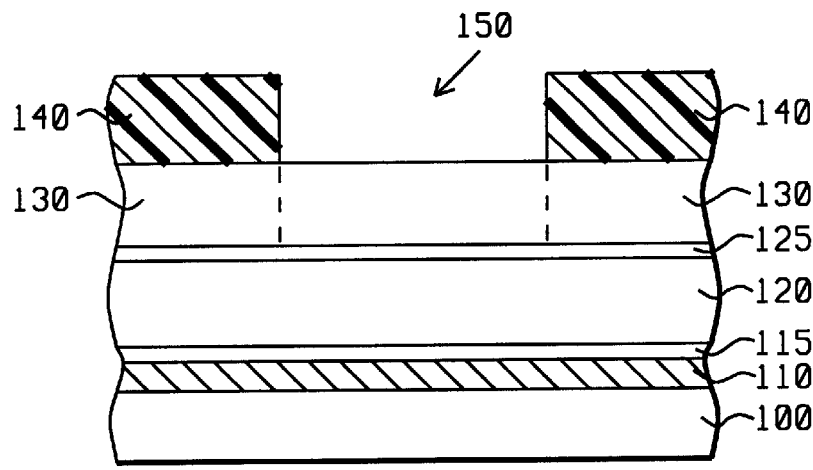
FIG. 1b – Prior Art
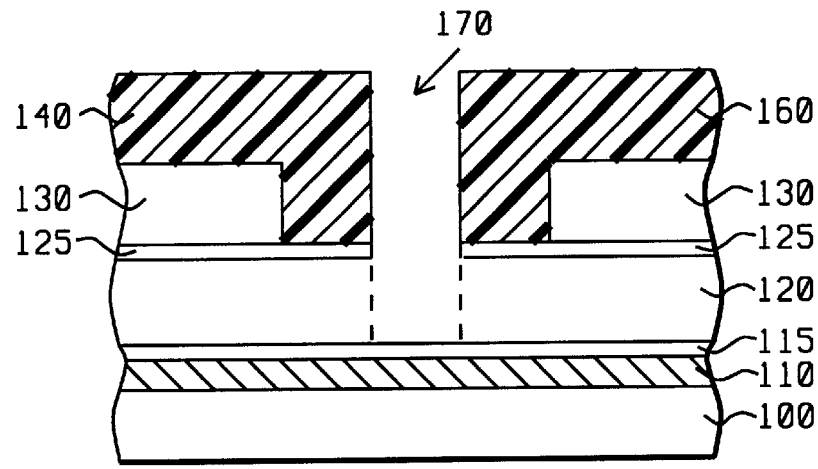
FIG. 1c – Prior Art

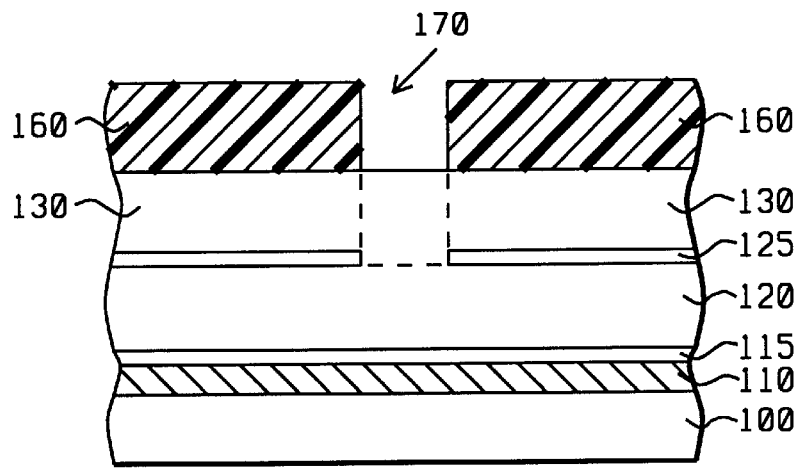
FIG. 1d - Prior Art
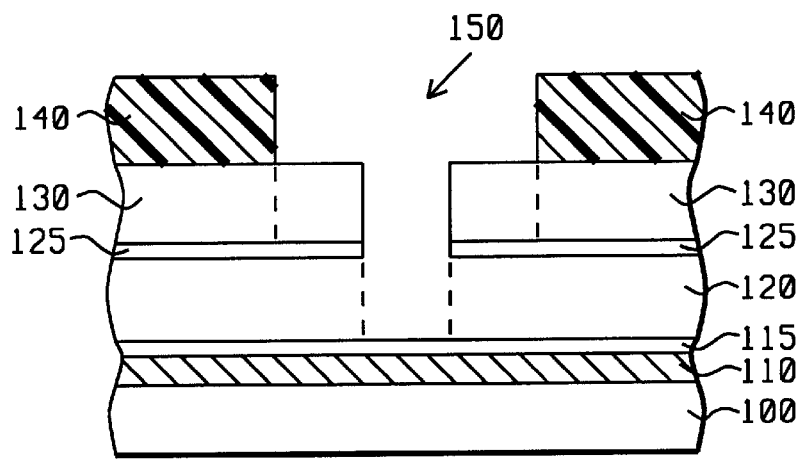
FIG. 1e - Prior Art
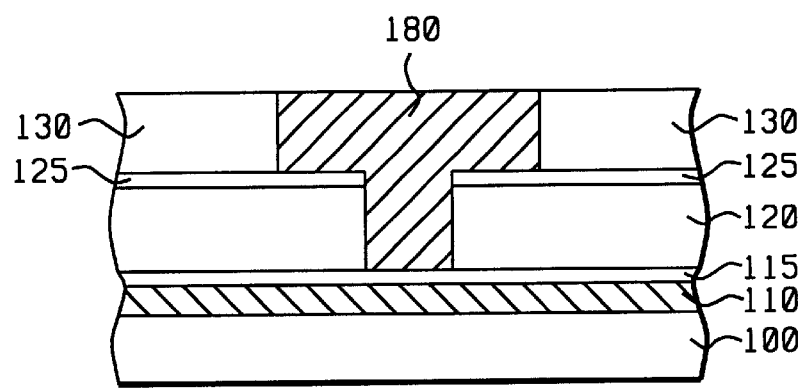
FIG. 1f - Prior Art

PARTIAL HARD MASK OPEN PROCESS FOR HARD MASK DUAL DAMASCENE ETCH

BACKGROUND OF THE INVENTION (1) Field of the Invention

The present invention relates to the manufacture of semiconductor devices in general, and in particular, to a method of forming a dual damascene using a partial hard A mask open process, especially suited for low-k dielectric structures.

(2) Description of the Related Art

Dual damascene process —which is explained more in detail below— makes it possible to inlay within a surface a dual layered structure, such as a trench and a smaller hole vertically through it to make connection to a lower level structure, which then can be filled with a filler material. In the semiconductor industry, the filler material is usually a metal, and the dual damascene structure, a metal interconnect which comprises a metal line in the trench and the via or contact metal in the hole that makes connection to the next level of an integrated circuit. Forming the trench to a particular depth from the surface, and then forming the hole, in this or reverse order, requires precise process steps, including masks for patterning the various shapes and sizes of trenches, and the more uniformly shaped holes on and within the structure. Usually a single mask is used for a single layered damascene structure while dual masks are used for a dual damascene structure where each mask determines the depth at which each layer of the two level structure stops. For this reason, these masks are sometimes referred to as "etch-stop" layers, as is well known in the art. However, it is disclosed later in the embodiments of the present invention a method of forming dual damascene structures with a partial hard mask through a judicious use of partial opening or etching of the mask which simplifies the dual damascene process, and makes it especially suitable for low-k dielectric materials in advanced sub-micron technologies capable of forming features approaching less than 0.10 micrometers ($\mu$m).

In one approach for a dual damascene process shown in FIG. 1a, two insulative layers (120) and (130), sometimes referred to as intermetal dielectrics (IMD), are formed on a substrate (100) with an intervening etch-stop or trench-stop layer (125). Substrate (100) is provided with metal layer (110) and another etch-stop layer or via-stop liner (115). Metal layer can be the commonly used aluminum or copper, while the liner can be another dielectric layer. A desired trench or trench pattern (150) is first etched into the upper insulative material (130) using conventional photolithographic methods and photoresist (140). The etching stops on trench-stop layer (125). Next, a second photoresist layer (160) is formed over the substrate, thus filling the trench opening (150), and patterned with hole opening (170), as shown in FIG. 1b. The hole pattern is then etched into the lower insulative layer (120) as shown in FIG. 1c and photoresist removed, thus forming the dual damascene structure shown in FIG. 1f.

Or, the order in which the trench and the hole are formed can be reversed. Thus, the upper insulative layer (130) is first etched, or patterned, with hole (170), as shown in FIG. 1d. The hole pattern is also formed into etch-stop layer (125). Then, the upper layer is etched to form trench (150) while at the same time the etching transfers the hole pattern in the etch-stop layer into lower insulation layer (120), as shown in FIG. 1e. It will be noted that trench-stop layer (125) stops the etching of the trench into the lower insulation layer. Similarly, via-stop layer (115) also stops etching. However, layer (115) at the bottom of opening (170) is removed before metal is deposited at the next step. Thus, after the completion of the thusly formed dual damascene structure, both the hole opening and trench opening are filled with metal (180), and any excess material on the surface of the substrate is removed by chemical mechanical polishing, as seen in FIG. 1f.

In prior art, various methods of forming damascene structures are described. In U.S. Pat. No. 6,140,220, Lin discloses a method in which the via hole is first lined with a layer of silicon nitride prior to adding a diffusion barrier and copper. This allows use of a barrier layer that is thinner than normal so that more copper may be included in the via hole, resulting in an improved conductance of the via. Another method is disclosed in U.S. Pat. No. 6,077,769, by Huang, et al., in order to overcome the narrowing of a damascene hole, which causes increased contact resistance. They accomplish this by avoiding the use of a conventional etching process with a very high $SiO_2$/SiN etching selectivity ratio. In still another U.S. Pat. No. 6,140,226, by Grill, et al., a different approach for forming dual damascene comprises a dual patterned hard mask which is used to form dual relief cavities with a first set of one or more layers with a first pattern, and a second set of one or more layers with a second pattern. On the other hand, Buramanian, et al., disclose in U.S. Pat. No. 6,127,089 a method of forming a dual damascene structure with low k dielectric materials by employing an imageable layer that is convertible to a hard mask upon exposure to a plasma etch that etches the low-k dielectric material.

It is disclosed later in the embodiments of the present invention a different method of forming a dual damascene structure with the use of a single hard mask that is partially opened initially to form a trench, and the via or contact hole at a later step.

SUMMARY OF THE INVENTION

It is therefore an object of this invention to provide a method of forming a dual damascene structure with the use of a partial hard mask open process.

It is another object of the present invention to provide a method of forming a dual damascene using fluorine-related etch chemistry in the hard mask open approach.

It is yet another object of the present invention to provide a method of forming a dual damascene having a porous low-k dielectric structure.

It is still another object of the present invention to provide a method of forming a dual damascene having a hybrid low-k dielectric structure.

It is an overall object of the present invention to provide a method of forming dual damascene structures especially suitable for advanced sub-micron technologies having features approaching less than 0.10 microns.

These objects are accomplished by providing a substrate having a via-stop layer formed over a first metal layer formed on a substrate; forming a dielectric layer over said via-stop layer; forming a hard mask over said dielectric layer; etching a partial trench opening in said hard mask; forming a via pattern photo mask over said substrate, including said partial trench opening; etching said via pattern in said photo mask into said partial trench opening in said hard mask; transferring said via pattern in said hard mask partially into said dielectric layer; extending said partial trench opening in said hard mask into the full depth of said hard mask; transferring said full depth trench in said hard mask into said dielectric layer; extending said via pattern partially in said dielectric layer into said via-stop layer until reaching said first metal layer; and forming second metal in said trench and via to complete said dual damascene process.

BRIEF DESCRIPTION OF THE DRAWINGS

FIGS. 1a–1c show the forming of a dual damascene structure where a line trench or groove is etched first into an upper second dielectric layer until an etch-stop layer is reached, and then the hole pattern etched into the lower first dielectric layer, according to prior art.

FIGS. 1d–1e show the forming of a dual damascene structure where a hole pattern is etched first into an upper second dielectric layer until an etch-stop layer is reached, and then the line pattern etched into the top layer while at the same time the hole pattern is transferred into the lower first dielectric layer, according to prior art.

FIG. 1f shows a dual damascene structure formed by either one of the methods shown in FIGS. 1a–1c or FIGS. 1d–1e, according to prior art.

DESCRIPTION OF THE PREFERRED EMBODIMENTS

Figure 2A:
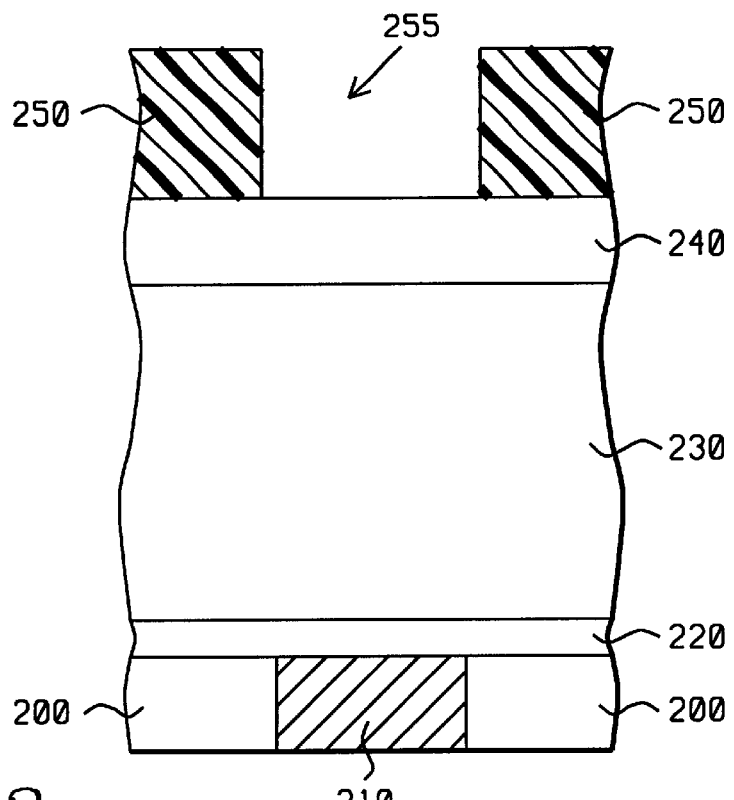
FIG. 2a is a partial cross-sectional view of a substrate showing the forming of a trench patterned first photoresist mask over a hard mask of this invention formed over a low-k dielectric layer on a substrate having a first metal layer, according to the present invention.

It is disclosed below in the embodiments of the present invention a method of forming a dual damascene structure utilizing a single layer hard mask. Conventionally, multi-hard mask schemes are used where an oxide forms the top layer and silicon nitride, SiON, the bottom layer of the dual layered hard mask. However, this scheme cannot be used for via etch with fluorine based chemistry due to poor selectivity (for the oxide hard mask) with hybrid (organic/CVD low-k materials) and porous intermetal dielectric materials in technologies that span 0.13 micrometer features and below. It is a main feature and key aspect of the present invention to use a high selectivity hardmask with partial hard mask opening even though multi-layers of the same material may be formed to circumvent some problems associated with photolithography and film adhesion. It is disclosed that the preferred hard mask material can be nitride, oxynitride and carbide, all of high oxide selectivity.

Referring now to the drawings, FIGS. 2a–2i, there is shown a method of forming dual damascene structures with a partial hard mask through a judicious use of partial opening or etching of the mask which simplifies the dual damascene process, and makes it especially suitable for low-k dielectric materials in advanced sub-micron technologies capable of forming features approaching less than 0.10 micrometers ($\mu$m).

Specifically, FIG. 2a shows a portion of a semiconductor substrate (200), which is preferably "IMD on silicon", that is, silicon having an intermetal dielectric (IMD) layer formed on a substructure of gates and interlevel dielectric layers (ILD) already formed thereon. It will be understood by those skilled in the art that IMD layers are formed between metal layers which are formed after forming an ILD layer over polysilicon gates and before first metal layer, and therefore the term "IMD on silicon" includes the substructure. Sometimes, ILD layer is also referred to as polysilicon/metal(1) dielectric, or PMD layer, but that term will not be used here. In FIG. 2a, the substrate is provided with a metal layer (210) and etch-stop layer, or, via-stop liner (220). The via-stop liner is also used to protect the pre-existing interconnect layer (210) from oxidation or corrosion during dry etching. Also, as is known in the art, an etch-stop layer may be used as a diffusion barrier layer when metallization is formed on the etch-stop layer. The interconnect metal is preferably copper with a thickness between about 2000 to 7000 Å, and the via-stop layer comprises a nitride or carbide with a thickness between about 300 to 1000 Å.

A low-k dielectric material with a dielectric constant less than 4.0 is next spun over, or grown over, the etchstop layer to form layer (230), as shown in FIG. 2a. Some of the conventional low-k materials are usually fluorinated, such as the amorphous fluorinated carbon ($\alpha$-C:F), poly-tetra-fluoro-ethylene (PTFE), fluorinated polyimide, fluorinated or $SiO_2$, phosphosilicate glass (PSG). Some others, such as benzocyclobutene (BCB), hydrogen silsesquioxane (HSQ) or the material known as FLARE manufactured by Allied Signal or SiLK manufactured by Dow Chemical have even lower dielectric constants. Some of the oxide based low-k dielectrics are porous, such as Nanoglass from Honeywell, LKD Series form JSR, XLX from Dow Corning. In the preferred embodiment, the thickness of the porous low-k dielectric layer is between about 4000 to 8000 Å. In a second embodiment, dielectric layer (230) is preferred to comprise an organic low-k material, such as BCB, FLARE, and SILK, and a chemical vapor deposited (CVD) oxide, the combination called a "hybrid low-k" dielectric. It is preferred that the thickness of hybrid low-k layer (230) is between about 4000 to 9000 Å, where the top organic layer has a thickness between about 2000 to 4000 Å and the lower CVD oxide layer has a thickness between about 2000 to 5000 Å.

In many cases, these low-k materials are incompatible with conventional photoresist stripping using oxygen ashers or solvents. Thus, the patterning of the low-k materials to form the trenches and vias of a damascene formation is a difficult task due to this incompatibility of the low-k materials with conventional photoresist stripping. That is, in most cases, the low-k etch chemistry etches the photoresist at approximately the same rate as the low k dielectric. It is, therefore, a key aspect of the present invention to use a hard mask which would have a low loss when etching the low-k dielectric. For this purpose, a full stack of high selectivity material, preferably, selected from a group consisting of nitride, oxynitride, carbide and other high oxide etch selectivity materials is used, having a thickness between about 1500 to 4000 Å. Thus, layer (240) is used as a hard mask to pattern low-k dielectric layer (230) with an organic etch.

Figure 2B:
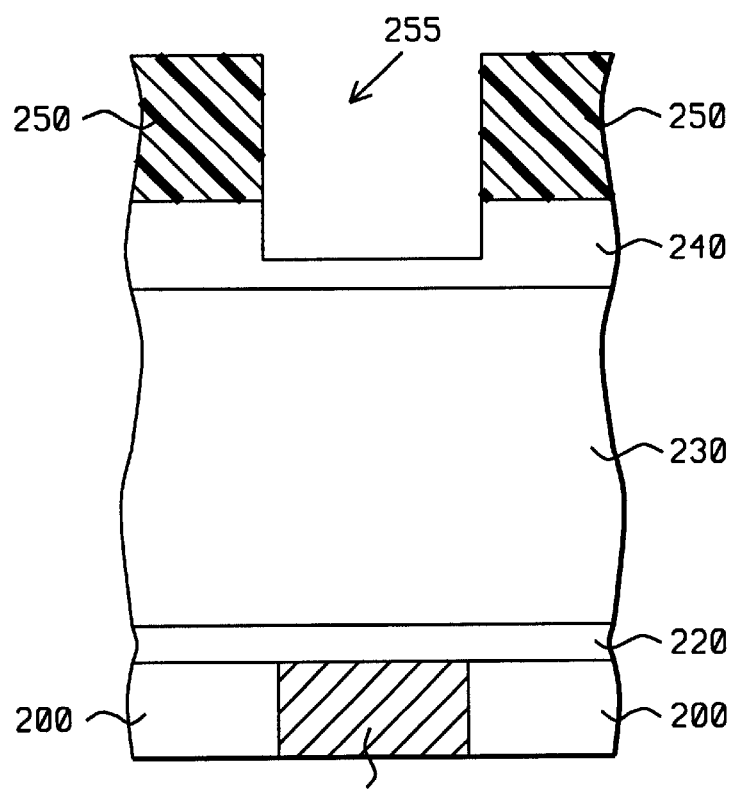
FIG. 2b is a partial cross-sectional view of a substrate showing the forming of the trench pattern of FIG. 2a partially into the hard mask of this invention.

However, first, first photoresist layer (250) is formed to form a mask with trench pattern (255), as shown in FIG. 2a. Then, as a main feature of the present invention, the trench pattern is etched into the hard mask by opening the hard mask only partially, as shown in FIG. 2b. Hence the partial hard mask open process for a dual damascene, because the remaining portion of the hard mask will be opened by etching in forming the via portion of the dual structure, as it will be described shortly. It will be obvious to those skilled in the art that by using the same hard mask twice through selective partial opening for the two portions of the dual damascene, the dual damascene etch process is simplified. Furthermore, unlike the high loss experienced with the conventional oxide/SiON dual mask, there is much less loss with the full stack hard mask of the instant invention in forming low-k damascene structures because of the high selectivity of the etch to the mask. It is preferred that the partial etch of the hard mask is accomplished with a recipe comprising $CH_xF_y/Ar/O_2$, such as $CF_4/Ar/O_2$, or $CH_2F_2/Ar/O_2$. A key aspect of the $CH_xF_y/Ar/O_2$ recipe is that it provides a linear depth-to-time etch relationship, as well as small depth micro-loading effect across different trench sizes, thus making depth control not a problem.

Figure 2C:
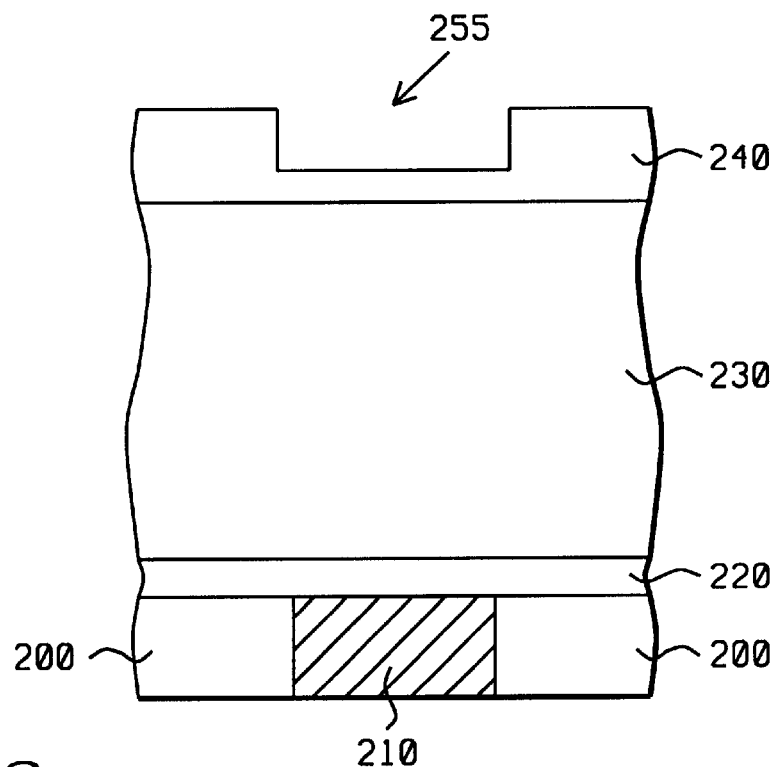
FIG. 2c is a partial cross-sectional view of a substrate showing the removal of the first photoresist mask of FIG. 2b, according to the present invention.
Figure 2D:
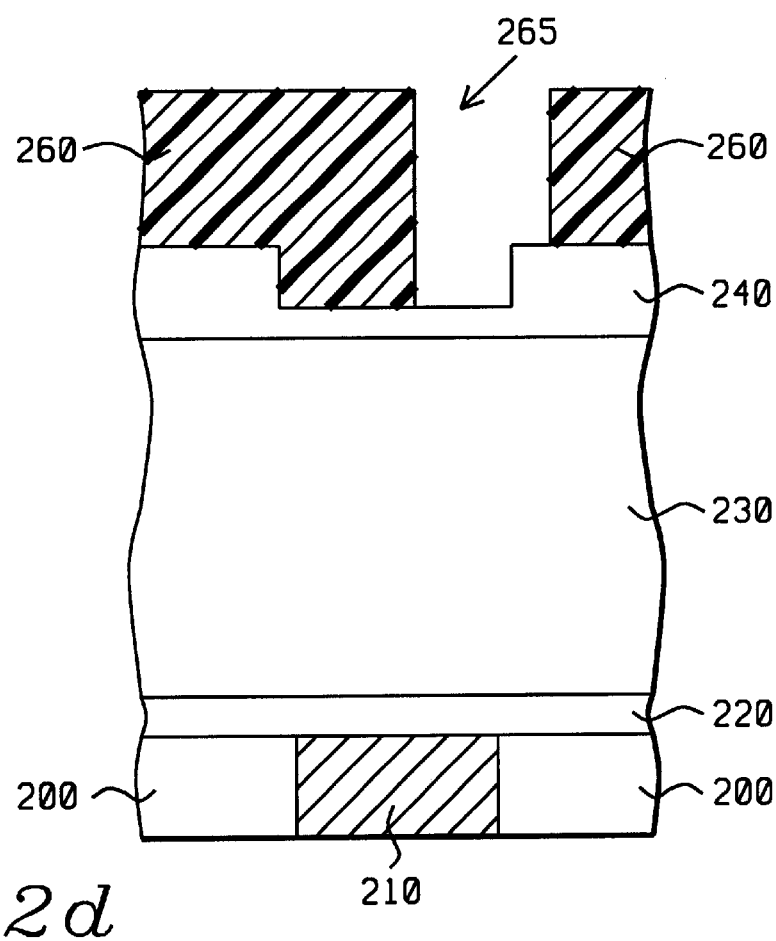
FIG. 2d is a partial cross-sectional view of a substrate showing the forming of a via patterned second photoresist mask over the substrate of FIG. 2c, including over the partial hard mask opening of this invention.
Figure 2E:
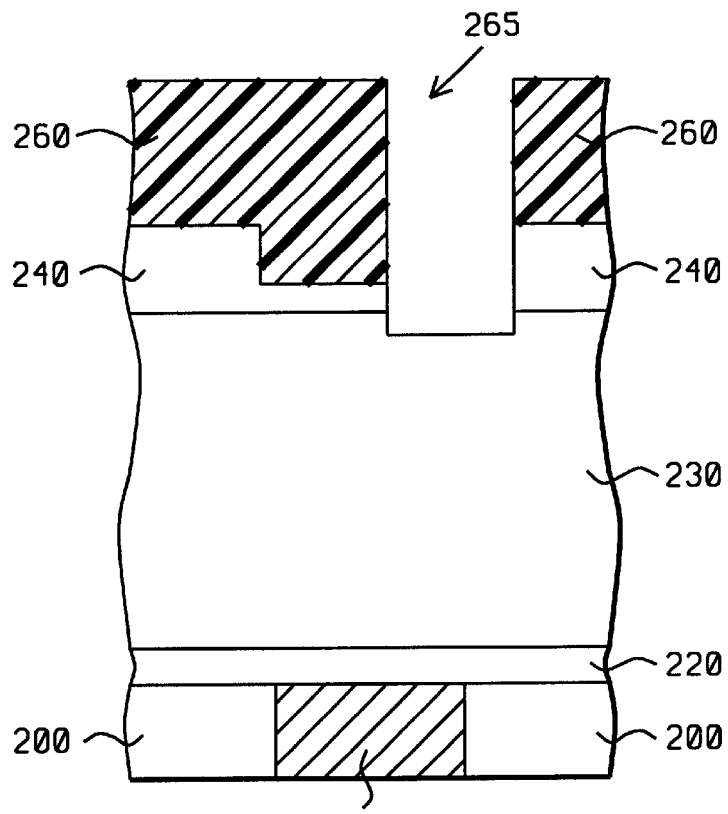
FIG. 2e is a partial cross-sectional view of a substrate showing the forming of the via pattern of FIG. 2d into the hard mask of this invention.

After the partial etching of the hard mask, first photo mask (250) is removed by any number of conventional techniques, including oxygen plasma ashing, as shown in FIG. 2c. A second photo mask, layer (260) in FIG. 2d, containing via pattern (265), is next formed over the substrate, including over the trench pattern of the partially opened hard mask. The via pattern is then etched into the partially opened hard mask where it is exposed as shown in FIG. 2e. It will be noted that the via pattern continues slightly into the low-k dielectric layer (230), as shown in the same Figure. The etching of the hard mask is performed using the same recipe as before, namely, $CH_xF_y/Ar/O_2$.

Figure 2F:
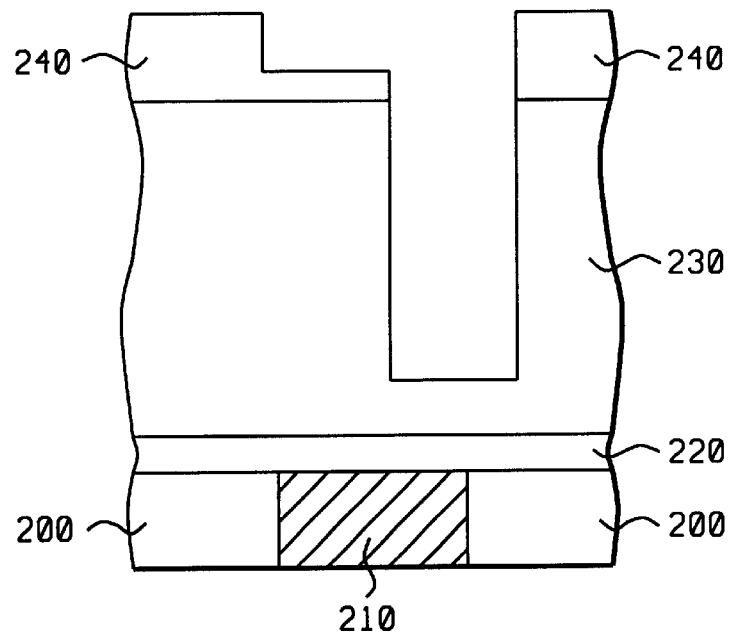
FIG. 2f is a partial cross-sectional view of a substrate showing the partial via etch into the low-k dielectric layer of FIG. 2e, according to the present invention.
Figure 2G:
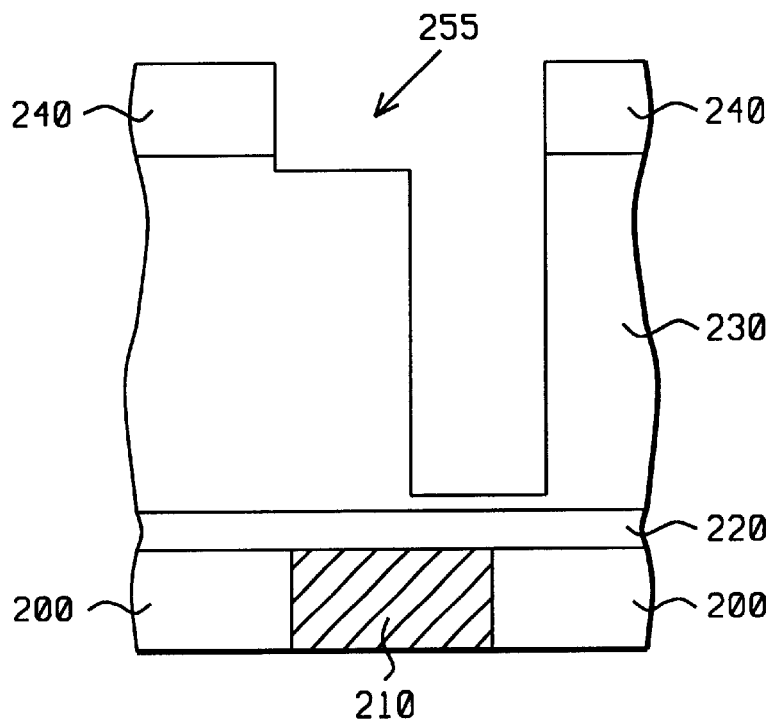
FIG. 2g is a partial cross-sectional view of a substrate showing the forming of the trench pattern of FIG. 2f into the hard mask of the present invention while at the same time extending further the via pattern into the low-k dielectric layer, according to the present invention.
Figure 2H:
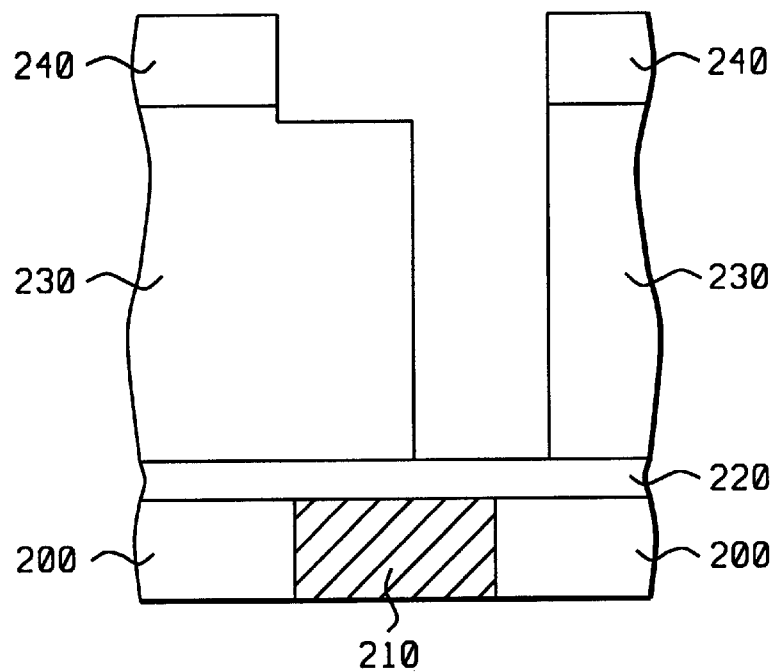
FIG. 2h is a partial cross-sectional view of a substrate showing the transferal of the trench pattern of FIG. 2g into the low-k dielectric layer, according to the present invention.
Figure 2I:
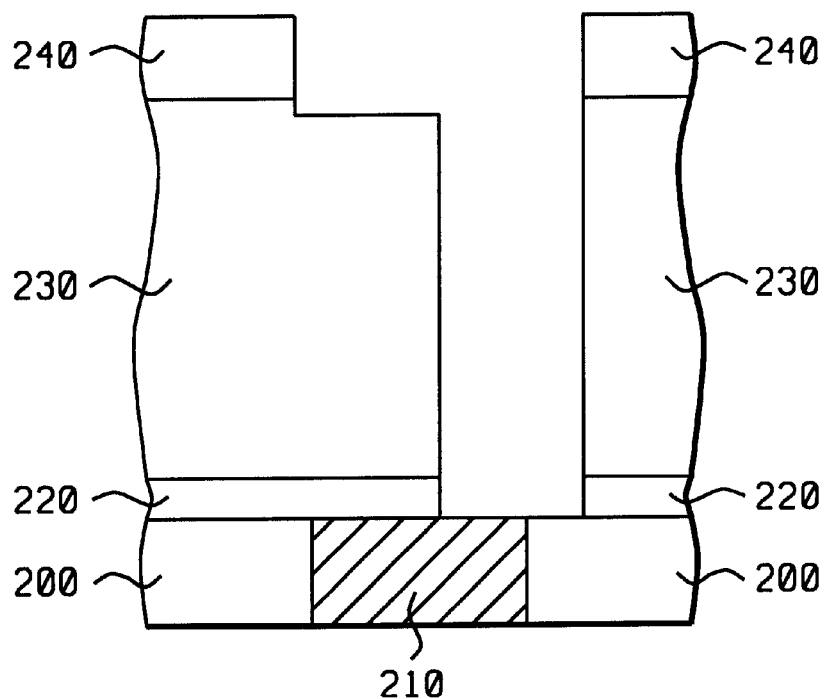
FIG. 2i is a partial cross-sectional view of a substrate showing the completion of the partial hard mask open process of this invention by connecting the dual damascene structure of FIG. 2h to the underlying metal layer, according to the present invention.

This is followed by the partial via etch of the low-k dielectric, layer (230) in FIG. 2f, by changing the etch recipe to $N_2/H_2/O_2$ chemistry for organic dielectrics and $C_xF_y/O_2/N_2/Ar$ for CVD and porous dielectrics after removing the second photoresist layer by oxygen plasma ashing. Next, partially open hard mask layer (240) is now judiciously opened to form trench (255) as shown in FIG. 2g. The same hard mask etch recipe as before is used at this step as well. Then the trench etch into the low-k dielectric layer is completed using the recipe comprising $N_2/H_2/O_2$ chemistry for organic dielectrics and $C_xF_y/O_2/N_2/Ar$ for CVD and porous dielectrics. At the same time, the via is extended until layer (220) is reached where etching stops. It will be noted that without an intermediate etch stop layer (not shown) for the trench portion, a timed etch can be used, depending upon the desired depth of the trench in the dielectric layer. As a final step, liner layer (220) is removed to make the dual damascene structure connect to the underlying metal layer (210) as shown in FIG. 2i. The dual damascene interconnect is then completed by filling the structure with metal, preferably copper.

While the invention has been particularly shown and described with reference to the preferred embodiments thereof, it will be understood by those skilled in the art that various changes in form and details may be made without departing from the spirit and scope of the invention.

What is claimed is:

1. A partial hard mask open process for hard mask dual damascene etch comprising the steps of:

providing a substrate having an etch-stop layer formed over a first metal layer formed on a substrate;

forming a dielectric layer over said etch-stop layer;

forming a hard mask over said dielectric layer;

forming a photomask having a trench pattern over said hard mask;

etching a partial trench opening in said hard mask;

forming a via pattern photo mask over said substrate, including said partial trench opening;

etching said via pattern in said photo mask into said partial trench opening in said hard mask;

transferring said via pattern in said hard mask partially into said dielectric layer;

extending said partial trench opening in said hard mask into the full depth of said hard mask;

transferring said full depth trench in said hard mask into said dielectric layer;

extending said via pattern partially in said dielectric layer into said etch-stop layer until reaching said first metal layer; and forming second metal in said trench and via to complete said dual damascene process.

2. The method of claim 1, wherein said substrate is silicon with an intermetal dielectric (IMD) layer formed thereon.

3. The method of claim 1, wherein said first metal is copper.

4. The method of claim 1, wherein said dielectric layer is a porous low-k dielectric having a dielectric constant less than 2.5.

5. The method of claim 1, wherein said dielectric layer has a thickness between about 4000 to 8000 Å.

6. The method of claim 1, wherein said hard mask is selected from a group consisting of oxynitride, carbide and high oxide etch selectivity materials.

7. The method of claim 1, wherein said hard mask has a thickness between about 1500 to 4000 Å.

8. The method of claim 1, wherein said etching said partial trench opening in said hard mask is accomplished with a recipe comprising $CH_xF_y/O_2/Ar$.

9. The method of claim 1, wherein said etching said via pattern into said hard mask is accomplished with a recipe comprising $CH_xF_y/O_2/Ar$.

10. The method of claim 1, wherein said transferring said via pattern in said hard mask partially into said dielectric layer is accomplished with a recipe comprising $N_2/H_2/O_2$ chemistry for organic dielectrics and $C_xF_y/O_2/N_2/Ar$ for CVD and low-k porous dielectrics.

11. The method of claim 1, wherein said extending said partial trench opening in said hard mask into the full depth of said hard mask is accomplished with a recipe comprising $CH_xF_y/O_2/Ar$.

12. The method of claim 1, wherein said transferring said full depth trench in said hard mask into said dielectric layer is accomplished with a recipe comprising $N_2/H_2/O_2$ chemistry for organic dielectrics and $C_xF_y/O_2/N_2/Ar$ for CVD and low-k porous dielectrics.

13. The method of claim 1, wherein said extending said via pattern partially in said dielectric layer into said barrier layer until reaching said first metal layer is accomplished with a recipe comprising $CH_xF_y/Ar/O_2$.

14. The method of claim 1, wherein said second metal is copper.

15. A partial hard mask open process for hard mask dual damascene etch comprising the steps of:

provem a substrate having an etch-stop layer formed over a first metal layer formed on a substrate;

forming a hybrid low-k dielectric layer over said etch-stop layer;

forming a hard mask over said hybrid low-k dielectric layer;

forming a first photo mask with a trench pattern over said substrate, including over said hard mask;

etching a partial trench opening in said hard mask through said trench pattern in said photo mask;

removing said first photo mask;

forming a via pattern second photo mask over said substrate, including over said partial trench opening;

etching said via pattern in said second photo mask into said partial trench opening in said hard mask;

removing said second photo mask;

transferring said via pattern in said hard mask partially into said dielectric layer;

extending said partial trench opening in said hard mask into the full depth of said hard mask;

transferring said full depth trench in said hard mask into said dielectric layer;

extending said via pattern partially in said dielectric layer into said barrier layer until reaching said first metal layer; and forming second metal in said trench and via to complete said dual damascene process.

16. The method of claim 15, wherein said substrate is silicon with an intermetal dielectric (IMD) formed thereon.

17. The method of claim 15, wherein said first metal is copper.

18. The method of claim 15, wherein said hybrid low-k dielectric layer comprises organic low-k material dielectric and CVD oxide.

19. The method of claim 15, wherein said hybrid low-k dielectric layer has a thickness between about 4000 to 9000 Å.

20. The method of claim 15, wherein said hard mask is selected from a group consisting of oxynitride, carbide and high oxide etch selectivity materials.

21. The method of claim 15, wherein said hard mask has a thickness between about 1500 to 4000 Å.

22. The method of claim 15, wherein said first photo mask has a thickness between about 3000 to 6000 Å.

23. The method of claim 15, wherein said etching said partial trench opening in said hard mask is accomplished with a recipe comprising $CH_xF_y/O_2/Ar$.

24. The method of claim 15, wherein said removing said first photo mask is accomplished by oxygen plasma ash.

25. The method of claim 15, wherein said second photo mask has a thickness between about 4000 to 7000 Å.

26. The method of claim 15, wherein said etching said via pattern into said hard mask is accomplished with a recipe comprising $CH_xF_y/O_2/Ar$.

27. The method of claim 15, wherein said transferring said via pattern in said hard mask partially into said hybrid low-k dielectric layer is accomplished with a recipe comprising $N_2/H_2/O_2$ chemistry for organic dielectrics and $C_xF_y/O_2/N_2/Ar$ for CVD and low-k porous dielectrics.

28. The method of claim 15, wherein said extending said partial trench opening in said hard mask into the full depth of said hard mask is accomplished with a recipe comprising $CH_xF_y/Ar/O_2$.

29. The method of claim 15, wherein said transferring said full depth trench in said hard mask into said hybrid low-k dielectric layer is accomplished with a recipe comprising $N_2/H_2/O_2$ chemistry for organic dielectrics and $C_xF_y/O_2/N_2/Ar$ for CVD and low-k porous dielectrics.

30. The method of claim 15, wherein said extending said via pattern partially in said dielectric layer into said barrier layer until reaching said first metal layer is accomplished with a recipe comprising $CH_xF_y/Ar/O_2$.

31. The method of claim 15, wherein said second metal comprises copper.

* * * * *